(12) United States Patent
Qin et al.

(10) Patent No.: US 12,317,697 B2
(45) Date of Patent: May 27, 2025

(54) DISPLAY PANEL AND MANUFACTURING METHOD THEREOF

(71) Applicants: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

(72) Inventors: Shijian Qin, Huizhou (CN); Lei Zhang, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/622,823

(22) PCT Filed: Dec. 14, 2021

(86) PCT No.: PCT/CN2021/137894
§ 371 (c)(1),
(2) Date: Dec. 26, 2021

(87) PCT Pub. No.: WO2023/097772
PCT Pub. Date: Jun. 8, 2023

(65) Prior Publication Data
US 2024/0032332 A1 Jan. 25, 2024

(30) Foreign Application Priority Data
Dec. 2, 2021 (CN) .......................... 202111458838.1

(51) Int. Cl.
*H10K 59/124* (2023.01)
*H10K 50/814* (2023.01)
(Continued)

(52) U.S. Cl.
CPC ......... *H10K 59/124* (2023.02); *H10K 50/814* (2023.02); *H10K 59/1201* (2023.02);
(Continued)

(58) Field of Classification Search
CPC ........................... H10K 59/124; H10K 59/122
See application file for complete search history.

(56) References Cited

U.S. PATENT DOCUMENTS

2016/0260924 A1   9/2016  Lee
2018/0123078 A1   5/2018  Byun
2022/0165980 A1*  5/2022  Shim .................... H10K 59/873

FOREIGN PATENT DOCUMENTS

CN   109979964 A   7/2019
CN   112310310 A   2/2021
(Continued)

OTHER PUBLICATIONS

Chinese Office Action issued in corresponding Chinese Patent Application No. 202111458838.1 dated Apr. 17, 2025, pp. 1-12.

*Primary Examiner* — Evan G Clinton
(74) *Attorney, Agent, or Firm* — PV IP PC; Wei Te Chung

(57) ABSTRACT

A display panel and a manufacturing method thereof are disclosed. Compared with the existing method of forming an under-cut structure through two processes of lithographing and wet etching, the manufacturing method of this disclosure can form the under-cut structure on a passivation layer through one etching process to save the production capacity, to form a double support to an organic light-emitting layer and a cathode through the cooperation of a planarization
(Continued)

layer and an anode layer, to enhance a support strength of the cathode to the organic light-emitting layer, and to avoid the collapse risk.

19 Claims, 7 Drawing Sheets

(51) Int. Cl.
*H10K 59/12* (2023.01)
*H10K 59/122* (2023.01)
*H10K 59/131* (2023.01)
*H10K 59/80* (2023.01)

(52) U.S. Cl.
CPC ......... *H10K 59/122* (2023.02); *H10K 59/131* (2023.02); *H10K 59/87* (2023.02)

(56) References Cited

FOREIGN PATENT DOCUMENTS

| | | | | | |
|---|---|---|---|---|---|
| CN | 113097408 | A | | 7/2021 | |
| CN | 113097409 | A | * | 7/2021 | ......... H01L 27/3244 |
| CN | 113097412 | A | | 7/2021 | |
| CN | 113488514 | A | | 10/2021 | |
| KR | 20160127459 | A | * | 11/2016 | ......... H01L 27/3248 |
| KR | 20180013226 | A | | 2/2018 | |

* cited by examiner

DISPLAY PANEL AND MANUFACTURING METHOD THEREOF

FIELD OF INVENTION

This disclosure relates to a technical field of a display, and more particularly to a display panel and a manufacturing method thereof.

BACKGROUND OF INVENTION

A transparent cathode of a self-luminous organic light-emitting diode display (OLED) is formed to have a thinner thickness due to the light transmission requirement, so that the square resistance is larger, and the current voltage drop (IR drop) of the panel becomes serious to cause the apparent uneven brightness phenomenon of the display panel, and the display effect of the OLED display device is affected seriously. At present, an OLED large-size panel is typically designed using a backpanel auxiliary cathode introduction method, and mainly decreases the IR drop through the formation of an under-cut structure connected to a cathode. In the manufacturing process of the existing OLED display panel, a support layer functioning as the cathode goes backwards in the process of forming the under-cut structure, so that the support effect of the support layer deteriorates and the collapse risk is present.

SUMMARY OF INVENTION

Technical Problems

An embodiment of this disclosure provides a display panel and a manufacturing method thereof to solve the problem of the collapse risk of the cathode present in the existing under-cut process.

Technical Solutions

An embodiment of this disclosure provides a manufacturing method of a display panel. The method includes following steps:
  providing an underlay substrate;
  sequentially forming a thin film transistor layer, an auxiliary electrode layer, a passivation layer and a planarization layer on the underlay substrate;
  forming a first contact hole on a surface of the planarization layer, wherein the first contact hole penetrates through the planarization layer and the passivation layer to expose at least a part of a source of the thin film transistor layer;
  forming a second contact hole on the surface of the planarization layer, wherein the second contact hole penetrates through the planarization layer and the passivation layer to expose a part of the auxiliary electrode layer;
  forming an anode layer on the surface of the planarization layer, wherein the anode layer is electrically connected to the source through the first contact hole, and the anode layer is deposited onto a surface of the auxiliary electrode layer through the second contact hole;
  forming a resist layer on a surface of the anode layer, and forming a first opening, which corresponds to the second contact hole, on a surface of the resist layer;
  etching and removing the anode layer deposited onto the surface of the auxiliary electrode layer to form a second opening, which corresponds to the first opening, on the surface of the anode layer;
  etching at least a part of the passivation layer covering the auxiliary electrode layer to form an under-cut chamber exposing at least a part of the auxiliary electrode layer;
  removing the resist layer;
  etching the anode layer to form an anode; and
  removing a remaining part of the anode layer.

Optionally, the step of removing the remaining part of the anode layer includes: reserving the anode layer deposited onto an inner wall of the second contact hole.

Optionally, the second contact hole includes a groove formed on the surface of the planarization layer, and a first through hole formed on a bottom surface of the groove and connected with the under-cut chamber, wherein an inner diameter of the groove gradually decreases from one end away from the auxiliary electrode layer to one end near the auxiliary electrode layer, the anode layer is deposited onto an inner wall of the groove, and an inner diameter of the second opening on the anode layer is greater than or equal to an inner diameter of the first through hole.

Optionally, an orthographic projection area of the first through hole on the surface of the auxiliary electrode layer is less than an orthographic projection area of the under-cut chamber on the surface of the auxiliary electrode layer.

Optionally, the step of sequentially forming the thin film transistor layer, the auxiliary electrode layer, the passivation layer and the planarization layer on the underlay substrate further includes: forming a second support layer on a surface of the passivation layer; the planarization layer covers the second support layer disposed above the auxiliary electrode layer; and the second contact hole penetrates through the planarization layer, the second support layer and the passivation layer.

Optionally, the second contact hole includes a first through hole formed on the planarization layer, and a second through hole formed on the second support layer and connected with the first through hole, an inner diameter of the first through hole gradually decreases from one end away from the auxiliary electrode layer to one end near the auxiliary electrode layer, and an inner diameter of the second through hole is less than an inner diameter of an opening of one end of the first through hole near the auxiliary electrode layer.

Optionally, an orthographic projection area of the second through hole on the surface of the auxiliary electrode layer is less than an orthographic projection area of the under-cut chamber on the surface of the auxiliary electrode layer.

Optionally, the second support layer disposed outside the second through hole forms a cover covering a part of the under-cut chamber.

Optionally, after the step of removing the remaining part of the anode layer, the method further includes:
  forming a pixel definition layer on the surface of the planarization layer;
  forming a first via, which exposes at least a part of the anode, on a surface of the pixel definition layer;
  forming a second via, which exposes the second contact hole, on the surface of the pixel definition layer;
  performing evaporation on the surface of the pixel definition layer to form an organic light-emitting layer, which is deposited onto a surface of the anode through the first via, and deposited onto the surface of the auxiliary electrode layer through the second via and the second contact hole; and
  performing evaporation on a surface of the organic light-emitting layer to form a cathode, which mates with the auxiliary electrode layer through the second via and the second contact hole.

An embodiment of this disclosure further provides a display panel, including: an underlay substrate; a thin film transistor layer disposed on a surface of the underlay substrate; an auxiliary electrode layer disposed on one side of a surface of the thin film transistor layer; a passivation layer disposed on the surface of the thin film transistor layer, wherein a surface of the passivation layer corresponding to the auxiliary electrode layer is formed with an under-cut chamber exposing at least a part of the auxiliary electrode layer; a planarization layer disposed on the surface of the passivation layer, wherein the surface of the planarization layer corresponding to the auxiliary electrode layer is formed with a groove, and a bottom surface of the groove is formed with a first through hole connected with the under-cut chamber; a first support layer being disposed on an inner wall of the groove and at least covering an inner bottom surface of the groove disposed outside the first through hole; an anode disposed on the surface of the planarization layer and electrically connected to a source of the thin film transistor layer; a pixel definition layer disposed on the surface of the planarization layer, wherein a surface of the pixel definition layer is formed with a first via exposing at least a part of the anode, and the surface of the pixel definition layer is formed with a second via connected with the groove; an organic light-emitting layer, which is disposed on the surface of the pixel definition layer, is electrically connected to the anode through the first via, extends to an inner side of the under-cut chamber through the second via, the groove and the first through hole, and covers a part of a surface of the auxiliary electrode layer; and a cathode, which is disposed on a surface of the organic light-emitting layer, extends into the under-cut chamber through the second via, the groove and the first through hole, and is electrically connected to the auxiliary electrode layer.

An embodiment of this disclosure further provides a display panel, including: an underlay substrate; a thin film transistor layer disposed on a surface of the underlay substrate; an auxiliary electrode layer disposed on one side of a surface of the thin film transistor layer; a passivation layer disposed on the surface of the thin film transistor layer, wherein a surface of the passivation layer corresponding to the auxiliary electrode layer is formed with an under-cut chamber exposing at least a part of the auxiliary electrode layer; a second support layer disposed on the surface of the passivation layer corresponding to the under-cut chamber, wherein a surface of the second support layer is formed with a second through hole exposing a part of the under-cut chamber; a planarization layer disposed on the surface of the passivation layer, wherein the surface of the planarization layer corresponding to the auxiliary electrode layer is formed with a groove, and a bottom surface of the groove is formed with a first through hole connected with the second through hole; an anode disposed on the surface of the planarization layer and electrically connected to a source of the thin film transistor layer; a pixel definition layer disposed on the surface of the planarization layer, wherein a surface of the pixel definition layer is formed with a first via exposing at least a part of the anode, and the surface of the pixel definition layer is formed with a second via connected with the groove; an organic light-emitting layer, which is disposed on the surface of the pixel definition layer, is electrically connected to the anode through the first via, extends to an inner side of the under-cut chamber through the second via, the groove, the first through hole and the second through hole, and covers a part of a surface of the auxiliary electrode layer; and a cathode, which is disposed on a surface of the organic light-emitting layer, extends into the under-cut chamber through the second via, the groove, the first through hole and the second through hole, and is electrically connected to the auxiliary electrode layer.

Beneficial Effects

Useful effects of this disclosure will be described in the following. Compared with the existing method of forming an under-cut structure through two processes of lithographing and wet etching, the manufacturing method of the display panel provided by this disclosure can form the under-cut structure on a passivation layer through one etching process to save the production capacity, to form a double support to an organic light-emitting layer and a cathode through the cooperation of a planarization layer and an anode layer, to enhance a support strength of the cathode to the organic light-emitting layer, and to avoid the collapse risk.

SYMBOLS

Figure 1:
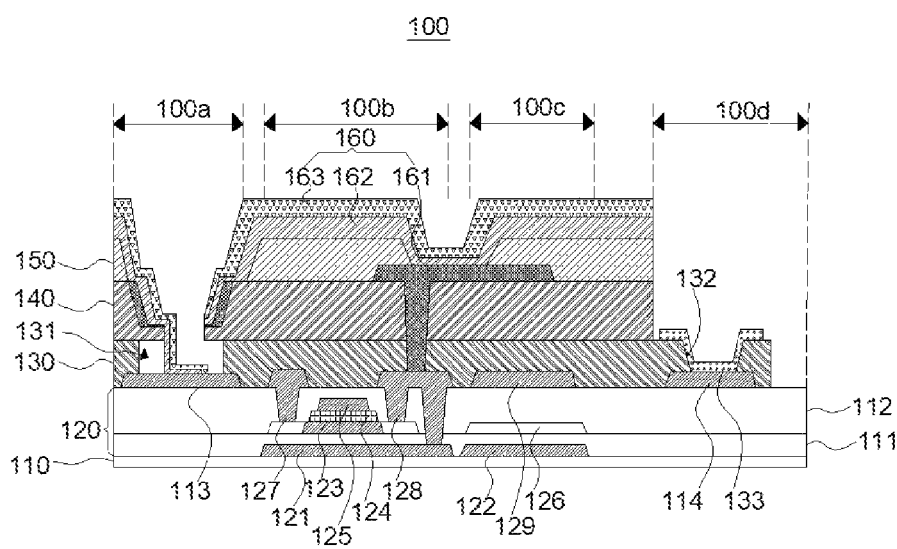
FIG. 1 is a schematic structure view showing a display panel of an exemplary embodiment of this disclosure.
Figure 2:
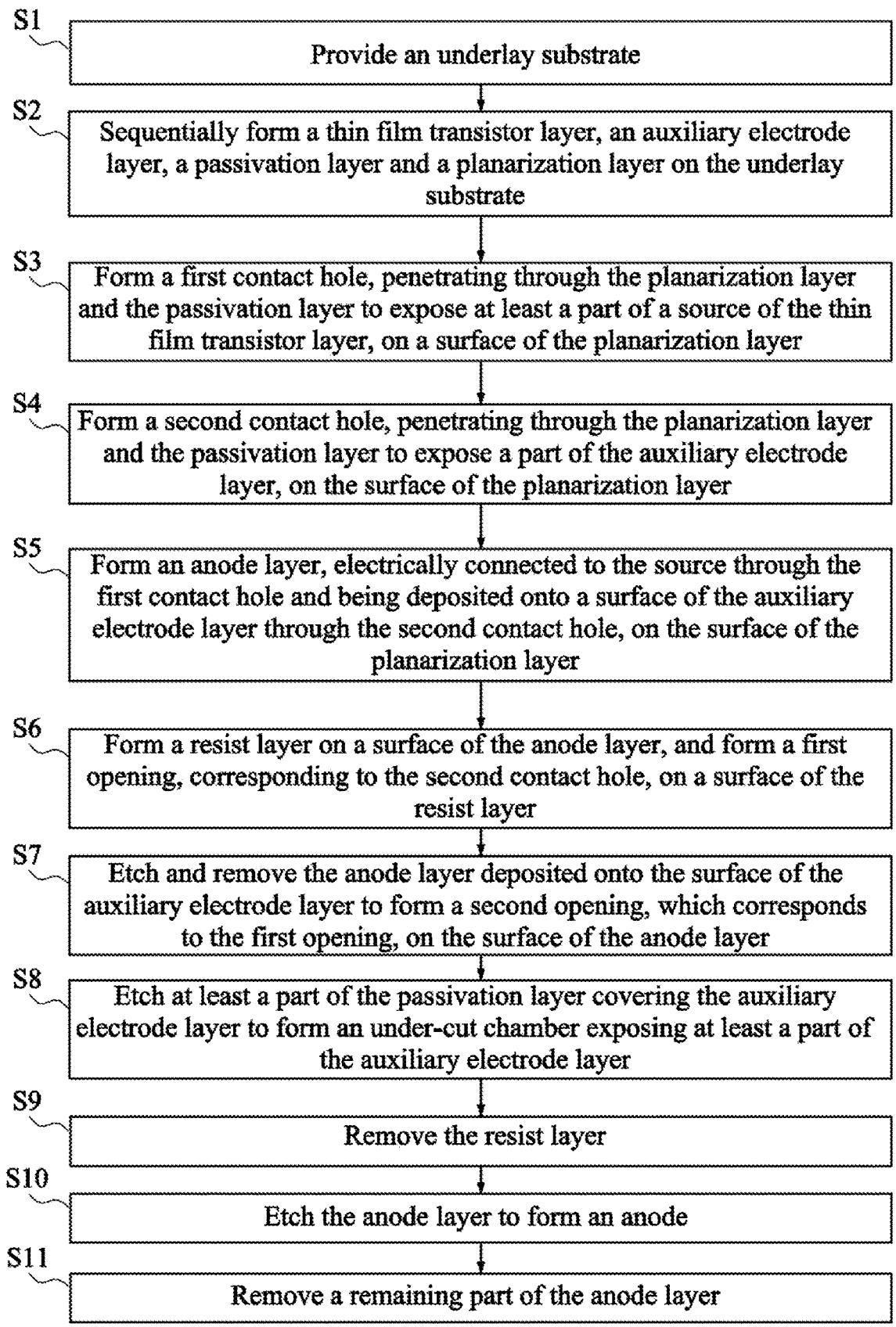
FIG. 2 is a flow chart showing a manufacturing method of a display panel of an exemplary embodiment of this disclosure.

100, 100': display panel; 100a: under-cut region; 100b: drive region; 100c: capacitor region; 100d: bonding region; 110: underlay substrate; 111: buffer layer; 112: interlayer insulating layer: 113: auxiliary electrode layer; 120: thin film transistor layer; 121: light-obstructing layer; 122: first electrode plate; 123: semiconductor layer; 124: gate insulating layer; 125: gate; 126: second electrode plate; 127: drain; 128: source; 129: source-drain; 130: passivation layer; 131: under-cut chamber; 132: bonding opening; 133: binding metal layer; 140: planarization layer; 141: first contact hole; 141a, 141a': second contact hole; 142: groove; 143: first through hole; 1431: protrusion; 1432: first support layer; 150: pixel definition layer; 151: first via; 152: second via; 160: light-emitting functional layer; 161: anode; 161a: anode layer; 161b: resist layer; 161c: first opening; 161d: second opening; 162: organic resist layer; 163: cathode; 170: second support layer; 171: second through hole.

DETAILED DESCRIPTION OF EMBODIMENTS

In the following, the technical solutions in the embodiments of this disclosure will be clearly and completely described with reference to the accompanying drawings in the embodiments of this disclosure. Obviously, the described embodiments are only a part of the embodiments of this disclosure, rather than all the embodiments. Based on the embodiments of this disclosure, all other embodiments obtained by those skilled in the art without creative works shall be deemed as falling within the protection scope of this disclosure.

Compared with the existing method of forming an under-cut structure through two processes of lithographing and wet etching, the manufacturing method of the display panel provided by this disclosure can form the under-cut structure on a passivation layer through one etching process to save the production capacity, to form a double support to an organic light-emitting layer and a cathode through the cooperation of a planarization layer and an anode layer, to enhance a support strength of the cathode to the organic light-emitting layer, and to avoid the collapse risk. As a typical application, the display panel may be applied to OLED large-size panels, which include a mobile phone, a tablet computer, a television, a display, a notebook computer and the like.

Referring to FIGS. 1 and FIGS. 3a to 3j, a display panel 100 provided by this disclosure in one embodiment of this disclosure includes an underlay substrate 110, a thin film transistor layer 120 formed on the underlay substrate 110, a passivation layer 130 formed on the thin film transistor layer 120, a planarization layer 140 formed on the passivation layer 130, a pixel definition layer 150 formed on the planarization layer 140 and a light-emitting functional layer 160 formed on the pixel definition layer 150. The light-emitting functional layer 160 includes an anode 161, an organic light-emitting layer 162 and a cathode 163 arranged in a stacked manner.

The display panel 100 includes an under-cut region 100a, a drive region 100b, a capacitor region 100c and a bonding region 100d separately arranged.

The thin film transistor layer 120 includes a light-obstructing layer 121 and a first electrode plate 122 disposed on the underlay substrate 110 and disposed in the same layer. The light-obstructing layer 121 corresponds to the drive region 100b, the first electrode plate 122 corresponds to the capacitor region 100c, a buffer layer 111 is disposed on the underlay substrate 110, the buffer layer 111 covers the light-obstructing layer 121 and the first electrode plate 122, the light-obstructing layer 121 is a metal layer, and the light-obstructing layer 121 and the first electrode plate 122 in the same layer form a first metal layer M1. A semiconductor layer 123 is disposed on a surface of the buffer layer 111 disposed above the light-obstructing layer 121. A gate insulating layer 124 and a gate 125 are disposed on a surface of the semiconductor layer 123 in a stacked manner, a second electrode plate 126 is disposed on a surface of the buffer layer 111 disposed above the first electrode plate 122, and the first electrode plate 122 and the second electrode plate 126 form a capacitor structure. An interlayer insulating layer 112 is formed on the buffer layer 111. A drain 127, a source 128 and a source-drain 129 are disposed on a surface of the interlayer insulating layer 112. The drain 127 and the source 128 correspond to the drive region 100b. The source-drain 129 corresponds to the capacitor region 100c. The drain 127 and the source 128 are electrically connected to the semiconductor layer 123. The source 128 is electrically connected to the light-obstructing layer 121.

An auxiliary electrode layer 113 is disposed on the interlayer insulating layer 112 corresponding to the under-cut region 100a. A bonding electrode layer 114 is disposed on the interlayer insulating layer 112 corresponding to the bonding region 100d. The auxiliary electrode layer 113, the drain 127, the source 128, the source-drain 129 and the bonding electrode layer 114 are disposed in the same layer to form a second metal layer M2.

The passivation layer 130 covers the auxiliary electrode layer 113, the drain 127, the source 128, the source-drain 129 and the bonding electrode layer 114. A surface of the passivation layer 130 corresponding to the auxiliary electrode layer 113 is formed with an under-cut chamber 131, which exposes at least a part of the auxiliary electrode layer 113. A surface of the passivation layer 130 corresponding to the bonding region 100d is formed with a bonding opening 132, which expose at least a part of the bonding electrode layer 114. A bonding metal layer 133 is disposed on a surface of the passivation layer 130 corresponding to the bonding opening 132. The bonding metal layer 133 is electrically connected to the bonding electrode layer 114 through the bonding opening 132. The bonding metal layer 133 forms a third metal layer M3.

The planarization layer 140 is disposed on a surface of the passivation layer 130 corresponding to the under-cut region 100a, the drive region 100b and the capacitor region 100c. The planarization layer 140 does not cover a surface of the passivation layer 130 corresponding to the bonding region 100d. A surface of the planarization layer 140 is formed with a first contact hole 141 exposing at least a part of the source 128. The surface of the planarization layer 140 corresponding to the auxiliary electrode layer 113 is formed with a groove 142. A bottom surface of the groove 142 is formed with a first through hole 143 penetrating through the planarization layer 140 and being connected to the under-cut chamber 131. An inner diameter of the groove 142 gradually decreases from one end away from the auxiliary electrode layer 113 to one end near the auxiliary electrode layer 113 to form an inverted trapezoidal cross-section structure of the groove 142. The passivation layer 130 disposed outside the first through hole 143 forms an annular protrusion 1431, which forms a partial occlusion to the under-cut chamber 131, so that an orthographic projection area of the first through hole 143 on a surface of the auxiliary electrode layer 113 is less than an orthographic projection area of the under-cut chamber 131 on the surface of the auxiliary electrode layer 113. In this embodiment, a first support layer 1432 is disposed on upper surfaces of at least two protrusions 1431. That is, the first support layer 1432 at least covers an inner bottom surface of the groove 142. In another implementation method, the first support layer 1432 covers the protrusion 1431, and further covers an inner sidewall surface of the groove 142 adjacent to the protrusion 1431.

The anode 161 is disposed on the surface of the planarization layer 140 corresponding to the first contact hole 141, and is electrically connected to the source 128 through the first contact hole 141. The first support layer 1432 and the anode 161 are formed by the same material to have the deposited structure of indium zinc oxide (IZO) and a silver-palladium-copper (APC) alloy (i.e., IZO/APC/IZO). The pixel definition layer 150 is disposed on the surface of the planarization layer 140. A surface of the pixel definition layer 150 is formed with a first via 151 exposing at least a part of the anode 161. A surface of the pixel definition layer 150 is formed with a second via 152 connected with the groove 142. The organic light-emitting layer 162 is disposed on the surface of the pixel definition layer 150. The organic light-emitting layer 162 is electrically connected to the anode 161 through the first via 151. The organic light-emitting layer 162 extends to an inner side of the under-cut chamber 131 through the second via 152, the groove 142 and the first through hole 143, and covers a part of the surface of the auxiliary electrode layer 113. The cathode 163 is disposed on a surface of the organic light-emitting layer 162. The cathode 163 extends into the under-cut chamber 131 through the second via 152, the groove 142 and the first through hole 143, and is electrically connected to the auxiliary electrode layer 113 not covered by the organic light-emitting layer 162. Holes in the anode 161 and electrons in the cathode 163 meet and combine in the organic light-emitting layer 162 under the conduction of current and voltage, thereby exciting the luminescent material in the organic light-emitting layer 162 to emit light.

In this embodiment, the groove 142 of the planarization layer 140 and the first support layer 1432 are used to jointly form a double support structure for the organic light-emitting layer 162 and the cathode 163, to guarantee the support strength and the support stability to the organic light-emitting layer 162 and the cathode 163, and to prevent the collapse risk from occurring. In addition, the protrusion 1431 disposed outside the first through hole 143 forms a partial occlusion to the under-cut chamber 131. Thus, when the organic light-emitting layer 162 is formed by evaporation, the organic light-emitting layer 162 only covers a part of the auxiliary electrode layer 113; and when the cathode 163 is formed by evaporation, the cathode 163 can be electrically connected to the auxiliary electrode layer 113 not covered by the organic light-emitting layer 162.

Referring to FIGS. 2 and 3a to 3j, a manufacturing method of the display panel 100 in this embodiment includes the following steps S1 to S11.

In S1, the underlay substrate 110 is provided.

Figure 3A:
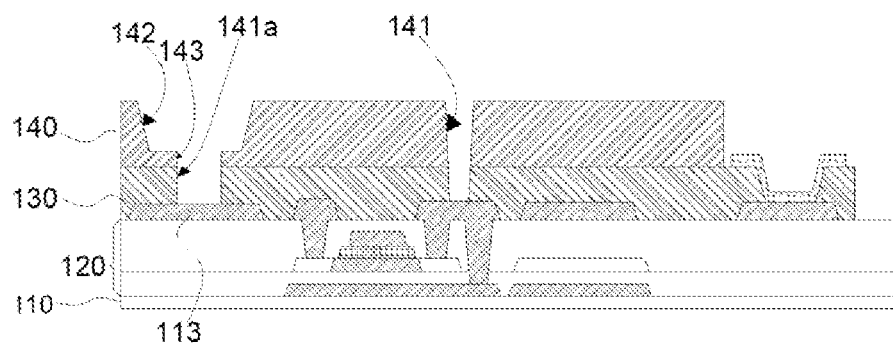
FIGS. 3a to 3j are schematic flow charts showing the manufacturing method of the display panel of the exemplary embodiment of this disclosure.

In S2, as shown in FIG. 3a, the thin film transistor layer 120, the auxiliary electrode layer 113, the passivation layer 130 and the planarization layer 140 are sequentially formed on the underlay substrate 110.

In S3, as shown in FIG. 3a, the first contact hole 141, which penetrates through the planarization layer 140 and the passivation layer 130 to expose the source 128 of at least a part of the thin film transistor layer 120, is formed on the surface of the planarization layer 140.

In S4, as shown into FIG. 3a, a second contact hole 141a, which penetrates through the planarization layer 140 and the passivation layer 130 to expose a part of the auxiliary electrode layer 113, is formed on the surface of the planarization layer 140.

Figure 3B:
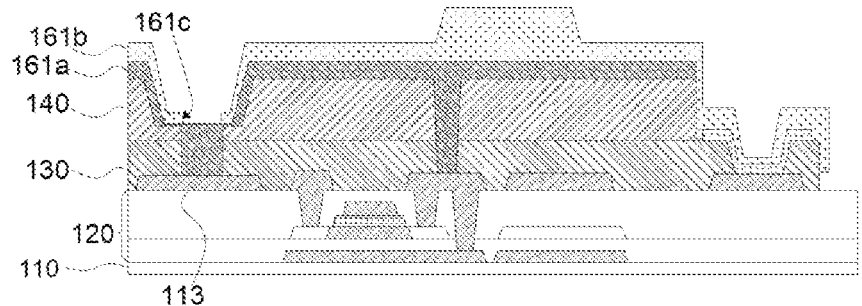

In S5, as shown in FIG. 3b, an anode layer 161a is formed on the surface of the planarization layer 140, wherein the anode layer 161a is electrically connected to the source 128 through the first contact hole 141, and the anode layer 161a is deposited onto a surface of the auxiliary electrode layer 113 through the second contact hole 141a.

In S6, as shown in FIG. 3b, a resist layer 161b is formed on a surface of the anode layer 161a, and a first opening 161c corresponding to the second contact hole 141a is formed on a surface of the resist layer 161b.

Figure 3C:
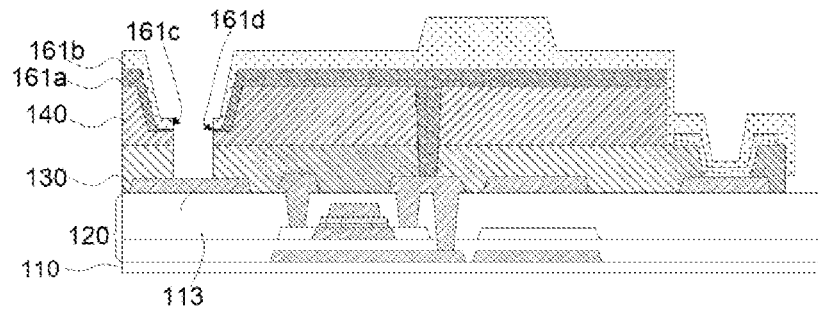

In S7, as shown in FIG. 3c, the anode layer 161a deposited onto the surface of the auxiliary electrode layer 113 is etched and removed to form a second opening 161d, which corresponds to the first opening 161c, on the surface of the anode layer 161a.

Figure 3D:
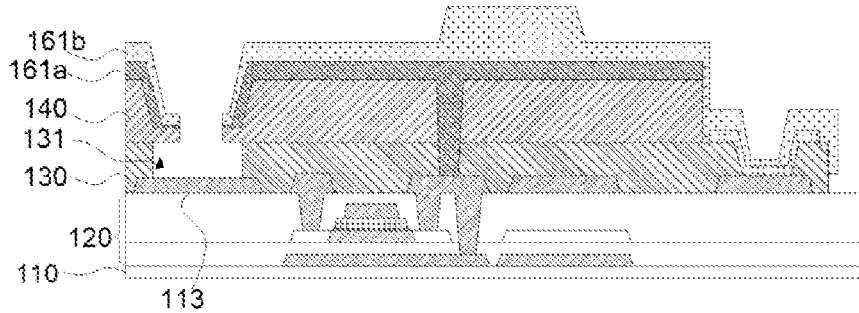

In S8, as shown in FIG. 3d, at least a part of the passivation layer 130 covering the auxiliary electrode layer 113 is etched to form the under-cut chamber 131 exposing at least a part of the auxiliary electrode layer 113.

Figure 3E:
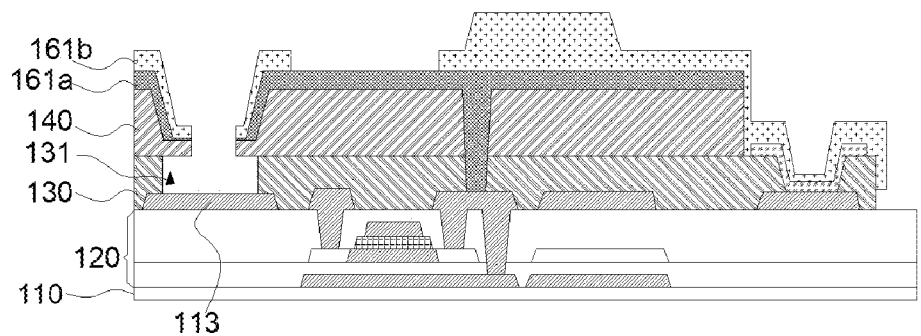
Figure 3F:
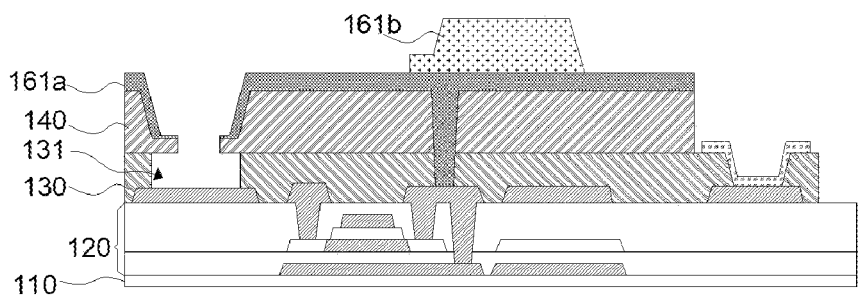

In S9, as shown in FIGS. 3e and 3f, the resist layer 161b is removed.

Figure 3G:
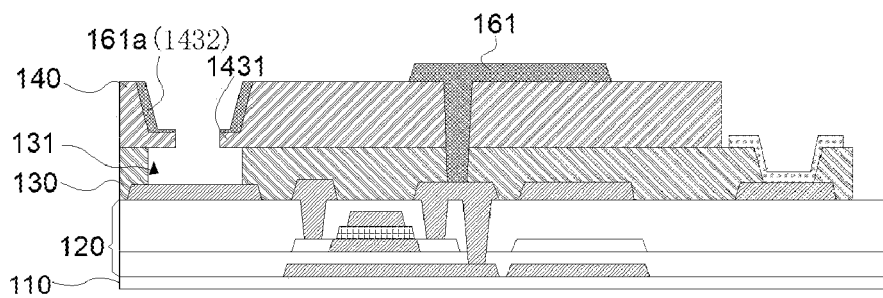

In S10, as shown in FIG. 3g, the anode layer 161a is etched to form the anode 161.

In S11, a remaining part of the anode layer 161a is removed.

Preferably, in the step S11, as shown in FIG. 3g, the anode layer 161a deposited onto an inner wall of the second contact hole 141a is reserved. The second contact hole 141a includes the groove 142 and the first through hole 143 formed on a bottom surface of the groove 142, wherein the anode layer 161a deposited onto an inner wall of the second contact hole 141a is the first support layer 1432 as previously mentioned.

In the step S6, the resist layer 161b covers the anode layer 161a and the bonding metal layer 133. The first opening 161c is formed on the surface of the resist layer 161b by using the lithographing (PH) process. In the mask adopted in the lithographing process, a mask region corresponding to the first through hole 143 is a full light transmission region, a mask region corresponding to the anode 161 is a full black region, and mask regions corresponding to other regions of the resist layer 161b are translucent regions. In the step S7, wet etching is used to remove the anode layer 161a deposited onto the surface of the auxiliary electrode layer 113 to form the second opening 161d. In the step S8, wet etching is used to remove a part of the passivation layer 130 to form the under-cut chamber 131, and the etchant is a hydrofluoric acid. In the step S9, dry ashing (DRY-ASH) is used to remove the resist layer 161b, but reserve the resist layer 161b corresponding to the under-cut region 100a and the resist layer 161b corresponding to the anode 161. In the step S10, wet etching is used to form the anode 161 and remove the remaining resist layer 161b in the step S9.

The manufacturing method of the display panel 100 further includes the following steps S12 to S16.

Figure 3H:
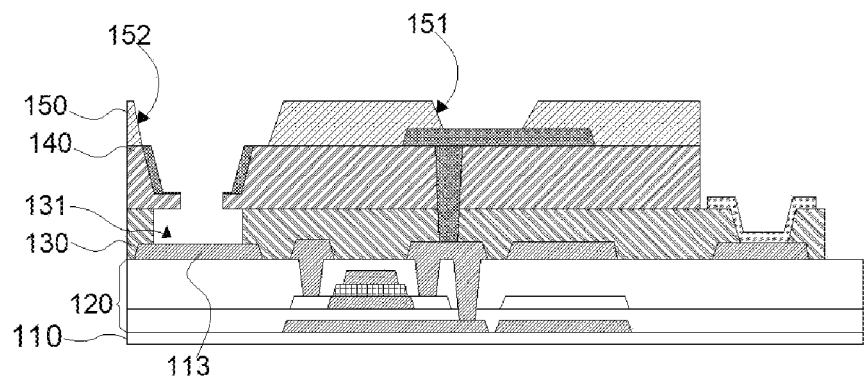

In S12, as shown in FIG. 3h, the pixel definition layer 150 is formed on the surface of the planarization layer 140.

In S13, as shown in FIG. 3h, the first via 151 exposing at least a part of the anode 161 is formed on the surface of the pixel definition layer 150.

In S14, as shown in FIG. 3h, the second via 152 exposing the second contact hole 141a is formed on the surface of the pixel definition layer 150.

Figure 3I:
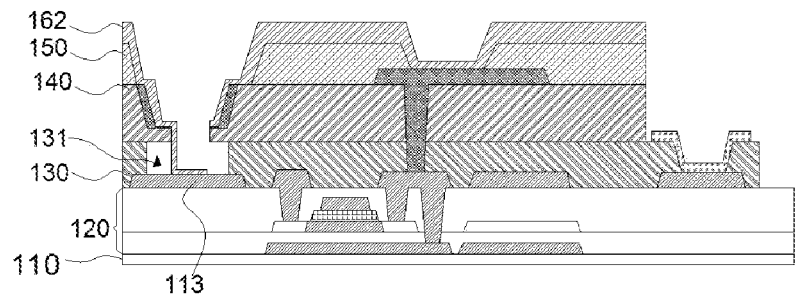

In S15, as shown in FIG. 3i, evaporation is performed on the surface of the pixel definition layer 150 to form the organic light-emitting layer 162, wherein the organic light-emitting layer 162 is deposited onto a surface of the anode 161 through the first via 151, and deposited onto the surface of the auxiliary electrode layer 113 through the second via 152 and the second contact hole 141a.

Figure 3J:
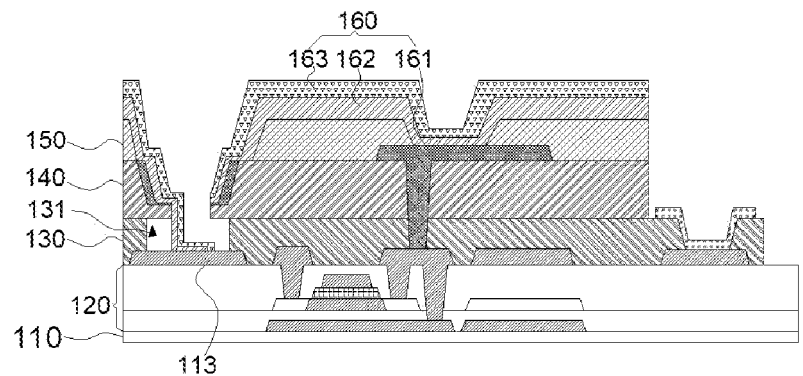

In S16, as shown in FIG. 3j, evaporation is performed on the surface of the organic light-emitting layer 162 to form the cathode 163, which mates with (or overlaps and connects with) the auxiliary electrode layer 113 through the second via 152 and the second contact hole 141a.

An evaporation angle for forming the organic light-emitting layer 162 is different from an evaporation angle for forming the cathode 163. For example, the evaporation angle of the organic light-emitting layer 162 ranges from 0° to 45°, and the evaporation angle of the cathode 163 ranges from −45° to 0°. Because the evaporation angles are different from each other, and the protrusion 1431 and the first support layer 1432 occlude the auxiliary electrode layer 113, the organic light-emitting layer 162 only covers a part of the auxiliary electrode layer 113, and the cathode 163 can further cover a part of the auxiliary electrode layer 113 while covering the organic light-emitting layer 162. Thus, it is possible to implement the electrical connection between the cathode 163 and the auxiliary electrode layer 113 and to reduce the voltage drop.

The manufacturing method of the display panel provided by this embodiment can form the under-cut chamber 131, which exposes at least a part of the auxiliary electrode layer 113, on the passivation layer 130 through one etching process. Compared with the existing process of forming the under-cut chamber through the lithographing process and the etching process, the lithographing production capacity is saved, and the waste is avoided.

Figure 4:
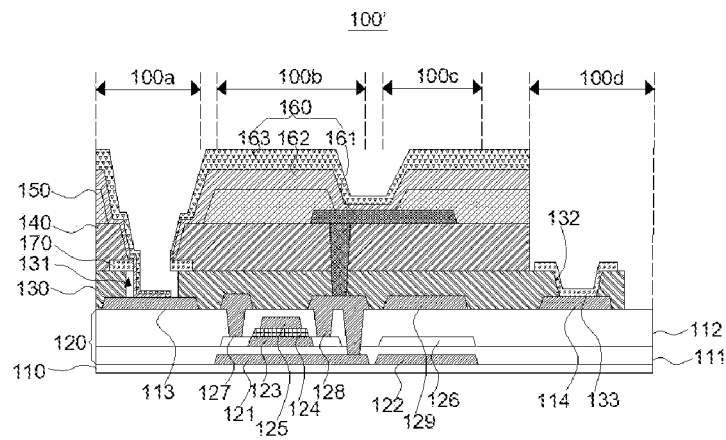
FIG. 4 is a schematic structure view showing a display panel of another exemplary embodiment of this disclosure.

Referring to FIG. 4, a display panel 100' in another embodiment includes an underlay substrate 110, a thin film transistor layer 120 formed on the underlay substrate 110, a passivation layer 130 formed on the thin film transistor layer 120, a planarization layer 140 formed on the passivation layer 130, a pixel definition layer 150 formed on the planarization layer 140 and a light-emitting functional layer 160 formed on the pixel definition layer 150. The light-emitting functional layer 160 includes an anode 161, an organic light-emitting layer 162 and a cathode 163 arranged in a stacked manner.

The display panel 100' includes an under-cut region 100a, a drive region 100b, a capacitor region 100c and a bonding region 100d separately arranged. A surface of the passivation layer 130 corresponding to the under-cut region 100a is provided with a second support layer 170 being a metal layer. The second support layer 170 and the bonding metal layer 133 are disposed in the same layer to form a third metal layer M3.

A surface of the second support layer 170 is formed with a second through hole 171 corresponding to a first through hole 143, and an inner diameter of the first through hole 143 is equal to an inner diameter of the second through hole 171. A protrusion 1431 is disposed on the second support layer 170 located at two sides of the second through hole 171, and a groove 142 on the planarization layer 140 and the second support layer 170 jointly form a double support structure for the organic light-emitting layer 162 and the cathode 163. This can guarantee the support strength and the support stability to the organic light-emitting layer 162 and the cathode 163, and prevent the collapse risk from occurring. In addition, the second support layer 170 disposed outside of the second through hole 171 form the partial occlusion to the under-cut chamber 131. Thus, when the organic light-emitting layer 162 is formed by evaporation, the organic light-emitting layer 162 only covers a part of an auxiliary electrode layer 113; and when the cathode 163 is formed by evaporation, the cathode 163 can be electrically connected to the auxiliary electrode layer 113 not covered by the organic light-emitting layer 162.

Referring to FIGS. 5a to 5i, a manufacturing method of the display panel 100' provided by this embodiment includes the following steps.

In S1, the underlay substrate 110 is provided.

Figure 5A:
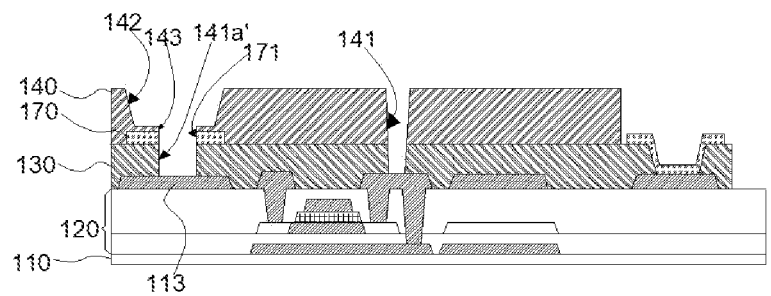
FIGS. 5a to 5i are schematic flow charts showing a manufacturing method of a display panel of another exemplary embodiment of this disclosure.

In S2', as shown in FIG. 5a, the thin film transistor layer 120, the auxiliary electrode layer 113, the passivation layer 130, the second support layer 170 and the planarization layer 140 are sequentially formed on the underlay substrate 110.

In S3', as shown in FIG. 5a, a first contact hole 141, which penetrates through the planarization layer 140 and the passivation layer 130 to expose at least a part of a source 128 of the thin film transistor layer 120, is formed on a surface of the planarization layer 140.

In S4', as shown in FIG. 5a, a second contact hole 141a', which penetrates through the planarization layer 140, the second support layer 170 and the passivation layer 130 to expose a part of the auxiliary electrode layer 113, is formed on the surface of the planarization layer 140.

Figure 5B:
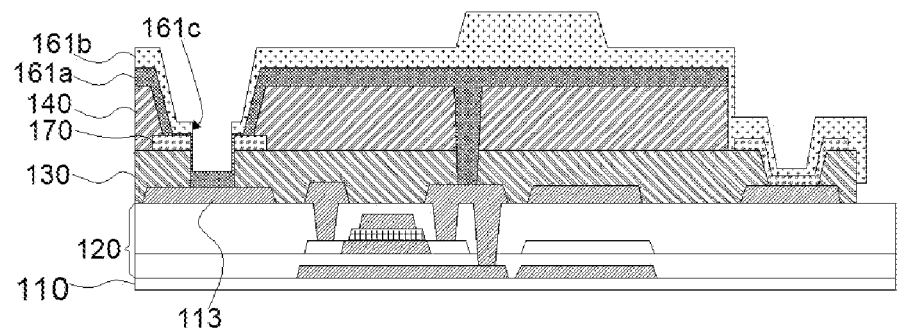

In S5', as shown in FIG. 5b, an anode layer 161a is formed on the surface of the planarization layer 140, the anode layer 161a is electrically connected to the source 128 through the first contact hole 141, and the anode layer 161a is deposited onto a surface of the auxiliary electrode layer 113 through the second contact hole 141a'.

In S6', as shown in FIG. 5b, a resist layer 161b is formed on a surface of the anode layer 161a, and a first opening 161c corresponding to the second contact hole 141a' is formed on a surface of the resist layer 161b.

Figure 5C:
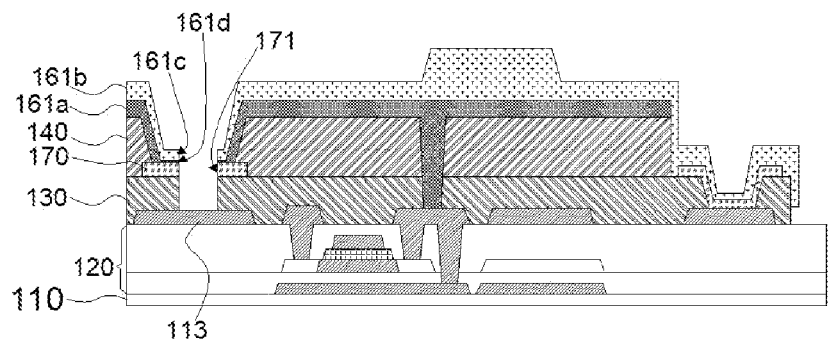

In S7, as shown in FIG. 5c, the anode layer 161a deposited onto the surface of the auxiliary electrode layer 113 is etched and removed to form a second opening 161d, which corresponds to the first opening 161c, on the surface of the anode layer 161a.

Figure 5D:
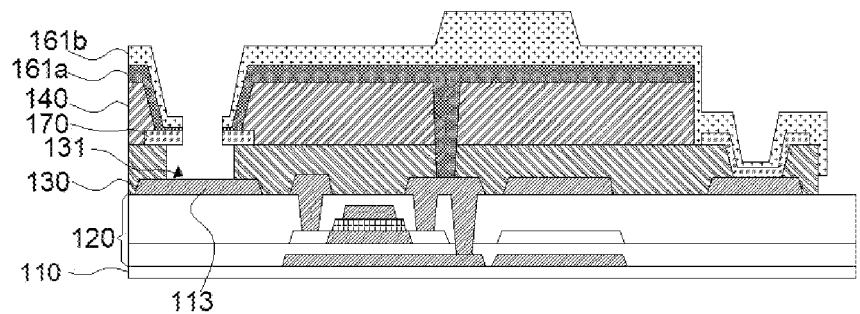

In S8, as shown in FIG. 5d, at least a part of the passivation layer 130 covering the auxiliary electrode layer 113 is etched to form an under-cut chamber 131 exposing at least a part of the auxiliary electrode layer 113.

Figure 5E:
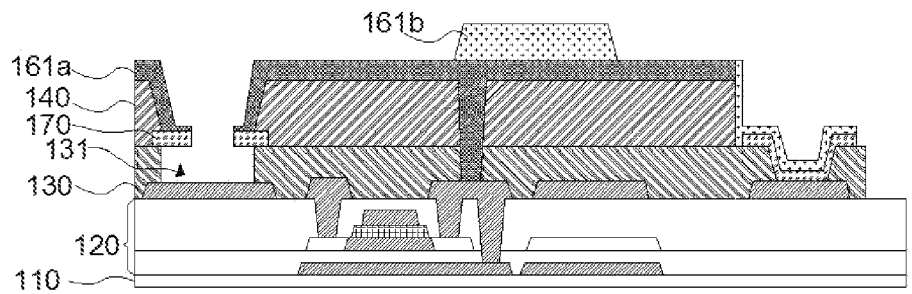

In S9, as shown in FIG. 5e, the resist layer 161b is removed.

Figure 5F:
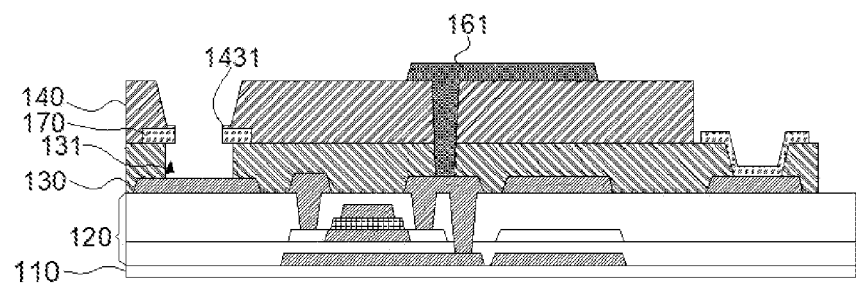

In S10, as shown in FIG. 5f, the anode layer 161a is etched to form the anode 161.

In S11, a remaining part of the anode layer 161a is removed.

The second contact hole 141a' of this embodiment includes the groove 142, the first through hole 143 is formed on a bottom surface of the groove 142, and the second through hole 171 is formed on the second support layer 170.

In the step S6', the resist layer 161b covers the anode layer 161a and the bonding metal layer 133. The first opening 161c is formed on the surface of the resist layer 161b by using the lithographing (PH) process. In the mask adopted in the lithographing process, a mask region corresponding to the first through hole 143 is a full light transmission region, a mask region corresponding to the anode 161 is a full black region, and mask regions corresponding to other regions of the resist layer 161b are translucent regions. In the step S9, dry ashing is used to remove the resist layer 161b, but reserve the resist layer 161b corresponding to the anode 161. In the step S10, the wet etching is used to form the anode 161 and remove the remaining resist layer 161b in the step S9.

The manufacturing method of the display panel 100' further includes the following steps.

Figure 5G:
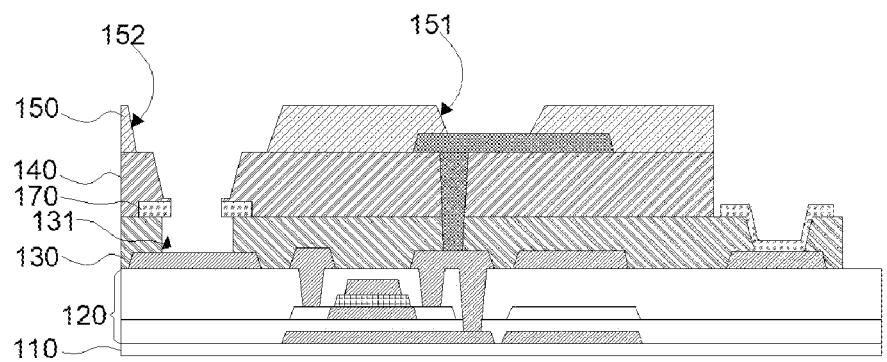

In S12, as shown in FIG. 5g, the pixel definition layer 150 is formed on the surface of the planarization layer 140.

In S13, as shown in FIG. 5g, a first via 151 exposing at least a part of the anode 161 is formed on a surface of the pixel definition layer 150.

In S14, as shown in FIG. 5g, a second via 152 exposing the second contact hole 141a' is formed on the surface of the pixel definition layer 150.

Figure 5H:
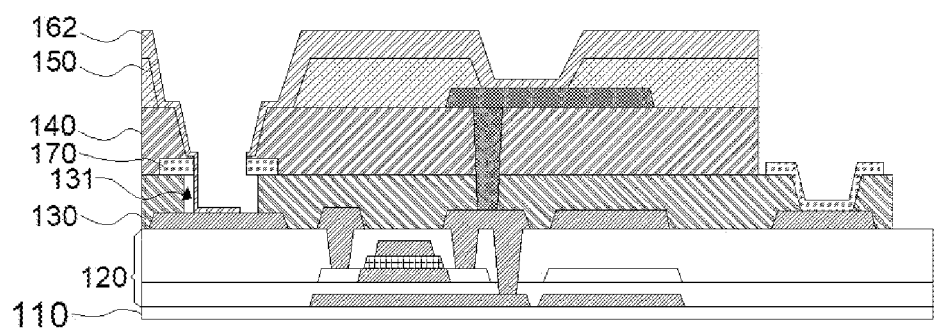

In S15, as shown in FIG. 5h, evaporation is performed on the surface of the pixel definition layer 150 to form the organic light-emitting layer 162, which is deposited onto a surface of the anode 161 through the first via 151, and deposited onto the surface of the auxiliary electrode layer 113 through the second via 152 and the second contact hole 141a'.

Figure 5I:
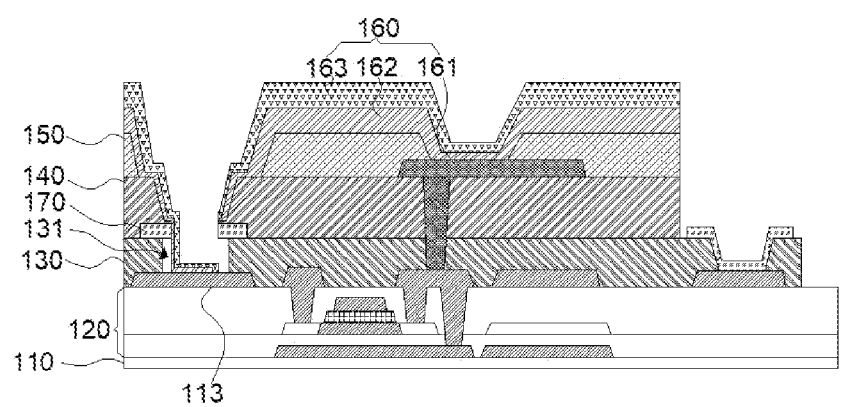

In S16, as shown in FIG. 5i, evaporation is performed on a surface of the organic light-emitting layer 162 to form the cathode 163, which mates with the auxiliary electrode layer 113 through the second via 152 and the second contact hole 141a'.

In summary, although this disclosure has been described in the above-mentioned preferred embodiments, the above-mentioned preferred embodiments are not intended to limit this disclosure, and various modifications and decorations may be made by those of ordinary skill in the art without departing from the spirit and scope of this disclosure. Therefore, the protection scope of this disclosure is subject to the scope defined by the claims.

What is claimed is:

1. A manufacturing method of a display panel, comprising following steps:
   providing an underlay substrate;
   sequentially forming a thin film transistor layer, an auxiliary electrode layer, a passivation layer and a planarization layer on the underlay substrate;
   forming a first contact hole on a surface of the planarization layer, wherein the first contact hole penetrates through the planarization layer and the passivation layer to expose at least a part of a source of the thin film transistor layer;
   forming an under-cut chamber on a surface of the passivation layer corresponding to the auxiliary electrode layer;
   forming a second contact hole on the surface of the planarization layer, wherein the second contact hole penetrates through the planarization layer and the passivation layer to expose a part of the auxiliary electrode layer; wherein the second contact hole comprises a groove formed on the surface of the planarization layer, and a first through hole formed on a bottom surface of the groove and connected with the under-cut chamber;
   forming at least two protrusions outside the first through hole in the passivation layer;
   forming a first support layer on each of the protrusions;
   forming an anode layer on the surface of the planarization layer, wherein the anode layer is electrically connected to the source through the first contact hole, and the anode layer is deposited onto a surface of the auxiliary electrode layer through the second contact hole;
   forming a resist layer on a surface of the anode layer, and forming a first opening, which corresponds to the second contact hole, on a surface of the resist layer;
   etching and removing the anode layer deposited onto the surface of the auxiliary electrode layer to form a second opening, which corresponds to the first opening, on the surface of the anode layer;
   etching at least a part of the passivation layer covering the auxiliary electrode layer to form an under-cut chamber exposing at least a part of the auxiliary electrode layer;
   removing the resist layer; etching the anode layer to form an anode; and
   removing a remaining part of the anode layer;
   forming a pixel definition layer on the surface of the planarization layer;
   forming a first via, which exposes at least a part of the anode, on a surface of the pixel definition layer; forming a second via, which exposes the second contact hole, on the surface of the pixel definition layer;
   performing evaporation on the surface of the pixel definition layer to form an organic light-emitting layer, which is deposited onto a surface of the anode through the first via, and deposited onto the surface of the auxiliary electrode layer through the second via and the second contact hole;
   performing evaporation on a surface of the organic light-emitting layer to form a cathode, the cathode extends to the under-cut chamber through the second via and the second contact hole, and the cathode covers one of the protrusions and mates with the auxiliary electrode layer.

2. The manufacturing method of the display panel according to claim 1, wherein the step of removing the remaining part of the anode layer comprises a following step: reserving the anode layer deposited onto an inner wall of the second contact hole.

3. The manufacturing method of the display panel according to claim 2, wherein an inner diameter of the groove gradually decreases from one end away from the auxiliary electrode layer to one end near the auxiliary electrode layer, the anode layer is deposited onto an inner wall of the groove, and an inner diameter of the second opening on the anode layer is greater than or equal to an inner diameter of an opening of one end of the first through hole.

4. The manufacturing method of the display panel according to claim 3, wherein an orthographic projection area of the first through hole on the surface of the auxiliary electrode layer is less than an orthographic projection area of the undercut chamber on the surface of the auxiliary electrode layer.

5. The manufacturing method of the display panel according to claim 1, wherein: the step of sequentially forming the thin film transistor layer, the auxiliary electrode layer, the passivation layer and the planarization layer on the underlay substrate further comprises a following step: forming a second support layer on a surface of the passivation layer; the planarization layer covers the second support layer disposed above the auxiliary electrode layer; and the second contact hole penetrates through the planarization layer, the second support layer and the passivation layer.

6. The manufacturing method of the display panel according to claim 5, wherein the second contact hole comprises a first through hole formed in the planarization layer, and a second through hole formed on the second support layer and connected with the first through hole, an inner diameter of the first through hole gradually decreases from one end away from the auxiliary electrode layer to one end near the auxiliary electrode layer, and an inner diameter of the second through hole is less than an inner diameter of an opening of one end of the first through hole near the auxiliary electrode layer.

7. The manufacturing method of the display panel according to claim 6, wherein an orthographic projection area of the second through hole on the surface of the auxiliary electrode layer is less than an orthographic projection area of the undercut chamber on the surface of the auxiliary electrode layer.

8. The manufacturing method of the display panel according to claim 7, wherein the second support layer disposed outside the second through hole forms a cover covering a part of the under-cut chamber.

9. The manufacturing method of the display panel according to claim 1, wherein an evaporation angle for forming the organic light-emitting layer is different from an evaporation angle for forming the cathode.

10. A display panel, comprising:
    an underlay substrate;
    a thin film transistor layer disposed on a surface of the underlay substrate;
    an auxiliary electrode layer disposed on one side of a surface of the thin film transistor layer;
    a passivation layer disposed on the surface of the thin film transistor layer, wherein a surface of the passivation layer corresponding to the auxiliary electrode layer is formed with an under-cut chamber exposing at least a part of the auxiliary electrode layer;
    a planarization layer disposed on the surface of the passivation layer, wherein the surface of the planarization layer corresponding to the auxiliary electrode layer is formed with a groove, and a bottom surface of the groove is formed with a first through hole connected with the under-cut chamber;

wherein the passivation layer disposed outside the first through hole forms at least two protrusions;

at least two first support layers being disposed on an inner wall of the groove and at least covering an inner bottom surface of the groove disposed outside the first through hole; wherein each of the first support layers is disposed on upper a surface of each of the at least two protrusions;

an anode disposed on the surface of the planarization layer and electrically connected to a source of the thin film transistor layer;

wherein each of the first support layers and the anode are formed by the same material;

a pixel definition layer disposed on the surface of the planarization layer, wherein a surface of the pixel definition layer is formed with a first via exposing at least a part of the anode, and the surface of the pixel definition layer is formed with a second via connected with the groove;

an organic light-emitting layer disposed on the surface of the pixel definition layer, and electrically connected to the anode through the first via, wherein the organic light-emitting layer extends to an inner side of the undercut chamber through the second via, the groove and the first through hole, and covers a part of a surface of the auxiliary electrode layer; and a cathode disposed on a surface of the organic light-emitting layer, wherein the cathode extends into the under-cut chamber through the second via, the groove and the first through hole, the cathode covers one of the at least two protrusions and is electrically connected to the auxiliary electrode layer.

11. The display panel according to claim 10, wherein an inner diameter of the groove gradually decreases from one end away from the auxiliary electrode layer to one end near the auxiliary electrode layer.

12. The display panel according to claim 11, wherein an orthographic projection area of the first through hole on the surface of the auxiliary electrode layer is less than an orthographic projection area of the under-cut chamber on the surface of the auxiliary electrode layer.

13. The display panel according to claim 10, wherein a buffer layer is disposed on the underlay substrate, an interlayer insulating layer is disposed on the buffer layer, a bonding electrode layer is disposed on the interlayer insulating layer, the surface of the passivation layer is formed with a bonding opening exposing at least a part of the bonding electrode layer, a bonding metal layer is disposed on the surface of the passivation layer corresponding to the bonding opening, and the bonding metal layer is electrically connected to the bonding electrode layer through the bonding opening.

14. A display panel, comprising:
an underlay substrate;
a thin film transistor layer disposed on a surface of the underlay substrate;
an auxiliary electrode layer disposed on one side of a surface of the thin film transistor layer;
a passivation layer disposed on the surface of the thin film transistor layer, wherein a surface of the passivation layer corresponding to the auxiliary electrode layer is formed with an under-cut chamber exposing at least a part of the auxiliary electrode layer;
at least two second support layers disposed on the surface of the passivation layer corresponding to the under-cut chamber, wherein a surface of the second support layer is formed with a second through hole exposing a part of the undercut chamber;

wherein the passivation layer disposed outside the second through hole forms at least two protrusions; each of the second support layers is disposed on upper surface of each of at least two protrusions;

a planarization layer disposed on the surface of the passivation layer, wherein the surface of the planarization layer corresponding to the auxiliary electrode layer is formed with a groove, and a bottom surface of the groove is formed with a first through hole connected with the second through hole;

an anode disposed on the surface of the planarization layer and electrically connected to a source of the thin film transistor layer;

wherein each of the second support layers and the anode are formed by the same material;

a pixel definition layer disposed on the surface of the planarization layer, wherein a surface of the pixel definition layer is formed with a first via exposing at least a part of the anode, and the surface of the pixel definition layer is formed with a second via connected with the groove; an organic light-emitting layer disposed on the surface of the pixel definition layer, and electrically connected to the anode through the first via, wherein the organic light-emitting layer extends to an inner side of the undercut chamber through the second via, the groove, the first through hole and the second through hole, and covers a part of a surface of the auxiliary electrode layer; and a cathode disposed on a surface of the organic light-emitting layer, wherein the cathode extends into the under-cut chamber through the second via, the groove, the first through hole and the second through hole, the cathode covers one of the at least two protrusions and is electrically connected to the auxiliary electrode layer.

15. The display panel according to claim 14, wherein an inner diameter of the groove gradually decreases from one end away from the auxiliary electrode layer to one end near the auxiliary electrode layer.

16. The display panel according to claim 15, wherein an orthographic projection area of the first through hole on the surface of the auxiliary electrode layer is less than an orthographic projection area of the under-cut chamber on the surface of the auxiliary electrode layer.

17. The display panel according to claim 16, wherein the second support layer disposed outside the second through hole forms a cover covering a part of the under-cut chamber.

18. The display panel according to claim 14, wherein a buffer layer is disposed on the underlay substrate, an interlayer insulating layer is disposed on the buffer layer, a bonding electrode layer is disposed on the interlayer insulating layer, the surface of the passivation layer is formed with a bonding opening exposing at least a part of the bonding electrode layer, a bonding metal layer is disposed on the surface of the passivation layer corresponding to the bonding opening, and the bonding metal layer is electrically connected to the bonding electrode layer through the bonding opening.

19. The display panel according to claim 18, wherein each of the second support layers is a metal layer, and each of the second support layers and the bonding metal layer are disposed in a same layer.

* * * * *